United States Patent [19]

Imagawa et al.

[11] Patent Number: 4,527,281
[45] Date of Patent: Jul. 2, 1985

[54] AUTO-SCAN CHANGEOVER SYSTEM FOR TWO-BAND RADIO RECEIVER EMPLOYING PLL FREQUENCY SYNTHESIZERS

[75] Inventors: Toshiyuki Imagawa; Kazuya Ohara, both of Saitama, Japan

[73] Assignee: Clarion Co., Ltd., Tokyo, Japan

[21] Appl. No.: 544,746

[22] Filed: Oct. 24, 1983

[30] Foreign Application Priority Data

Oct. 27, 1982 [JP] Japan .............................. 57-188587

[51] Int. Cl.³ .............................................. H03J 7/18
[52] U.S. Cl. ....................................... 455/165; 455/168
[58] Field of Search ............... 455/161, 165, 168, 183, 455/180; 334/18; 358/193.1

[56] References Cited

U.S. PATENT DOCUMENTS 3,942,121  3/1976  Bell et al. ........................ 455/165
4,222,121  9/1980  Matsumoto et al. ............. 455/165
4,361,906 11/1982  Sakamoto ........................ 455/183

FOREIGN PATENT DOCUMENTS 139523  8/1983  Japan ............................... 455/168

Primary Examiner—Jin F. Ng
Attorney, Agent, or Firm—Flynn, Thiel, Boutell & Tanis

[57] ABSTRACT

The auto-scan changeover system for a two-band radio receiver employing first and second PLL frequency synthesizers comprises: first detecting circuit responsive to a tuning frequency scanning signal from the first or second PLL frequency synthesizer for detecting completion of a scanning operation of a broadcasting band by first or second auto-scanning circuit; first switching circuit responsive to a detection signal from the first detecting circuit for switching a power supply between first and second broadcasting band reception circuits so as to render one of the reception circuits operative for reception; second detecting circuit for detecting that the first switching circuit switched the power supply to the first or second broadcasting band reception circuit; and second switch responsive to a detection signal from the second detecting circuit for actuating first or second broadcasting band auto-scanning circuit.

3 Claims, 5 Drawing Figures

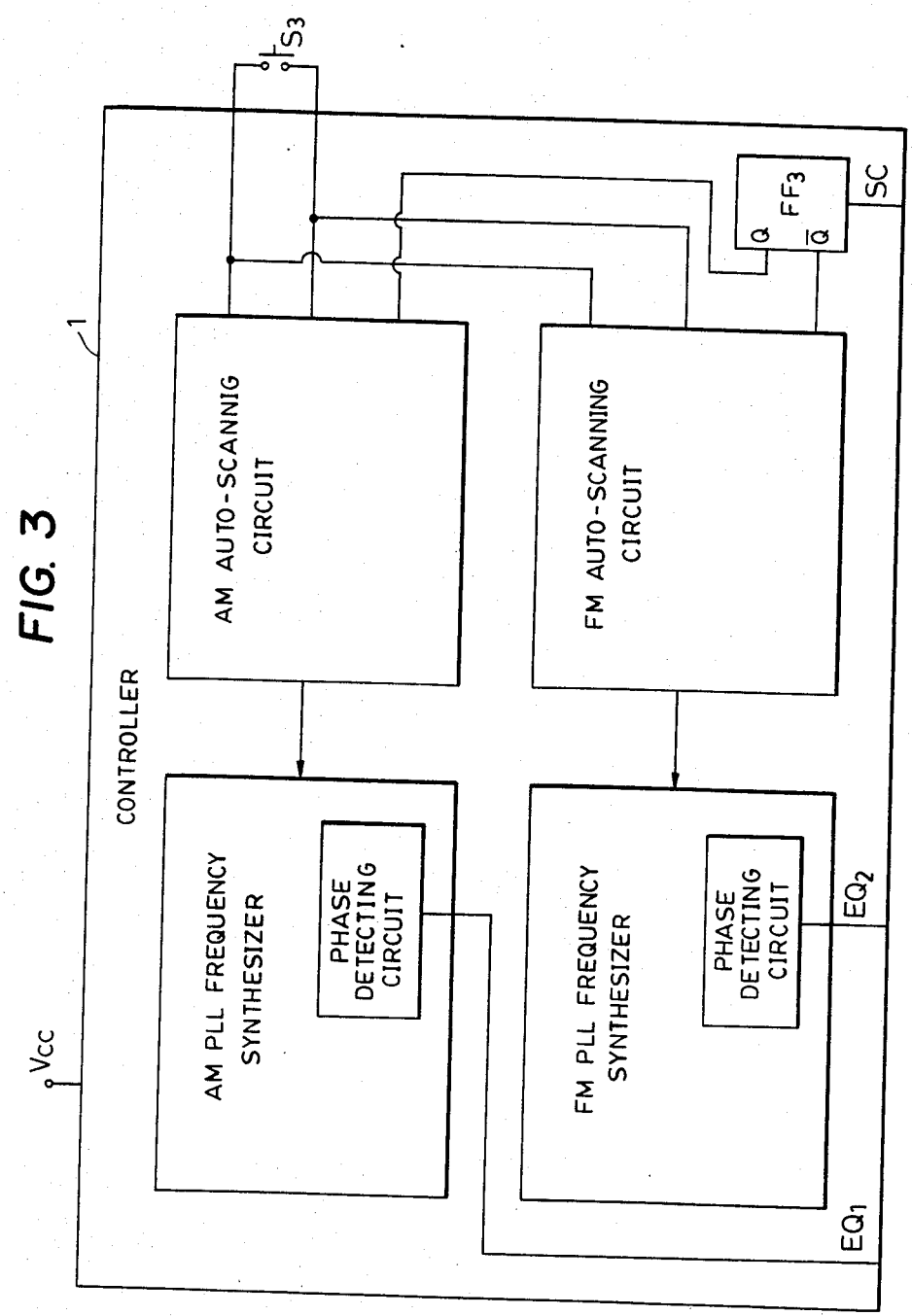

ical tuning circuit 2 via a low pass filter $LPF_1$
AUTO-SCAN CHANGEOVER SYSTEM FOR TWO-BAND RADIO RECEIVER EMPLOYING PLL FREQUENCY SYNTHESIZERS

FIELD OF THE INVENTION

This invention relates to an auto-scan changeover system for a radio receiver employing PLL (phase-locked loop) frequency synthesizers for reception of both the AM and FM band signals.

BACKGROUND OF THE INVENTION

In such a receiver, in general, automatic tuning is effected in the following manner. If a scan switch is turned on, for example, the AM or FM band is scanned from the lowest extremity to the highest extremity. If a broadcasting signal is detected, the scanning temporarily (for about 5 seconds, for example) stops there. If the automatic scanning mode is cancelled during the time, the radio receiver is tuned at the broadcasting station and continues receiving the signals from the station. If the automatic scanning mode is not cancelled during the temporary stay, the scanning operation starts again.

In case that there are merely a few FM broadcasting stations and programs as in Japan, a desired broadcasting program is often not caught even if the overall receivable band, i.e. 76.1 to 89.9 MHz, is automatically scanned by 100 kHz step. In a conventional system if a desired broadcasting program is not found by the FM band scanning, a user must change the band from FM to AM to succeedingly scan the AM band until the desired broadcasting program is caught. Additionally, since the band changeover must be done manually, the conventional system troubles users.

OBJECT OF THE INVENTION

It is therefore an object of the invention to omit the above-mentioned troublesome manual operation, by providing a novel auto-scan changeover system for a radio receiver employing two-band or three-band PLL frequency synthesizers which system is capable of automatically changing the scanning band from one band (FM, for example) to another (AM, for example) when a desired broadcasting program is not found as a result of a scanning of the former overall band from the lowest extremity to the highest extremity.

SUMMARY OF THE INVENTION

In accordance with the invention, there is provided an auto-scan changeover system for a two-band radio receiver employing PLL (phase-locked loop) frequency synthesizers, said system comprising:
first and second PLL frequency synthesizers for first and second broadcasting bands, respectively;
first detecting circuit responsive to a tuning frequency scanning signal from said respective synthesizers to detect completion of a scanning operation of said first or second broadcasing band;
first switching circuit responsive to a detection signal from said first detecting circuit to switch a power supply between first and second broadcasting band reception circuits in said radio receiver so as to render said first or second broadcasting band reception circuit operative for reception;
second detecting circuit for detecting that said first switching circuit switched said power supply to said first or second broadcasting band reception circuit;
first and second scanning circuits associated with said first and second broadcasting bands, respectively, to control said first and second synthesizers; and
second switching circuit responsive to a detection signal from said second detecting circuit to actuate said first or second scanning circuit.

BRIEF DESCRIPTION OF THE DRAWINGS

FIG. 3 is a block diagram of an example of a controller 1 in FIG. 1.

DETAILED DESCRIPTION OF THE PREFERRED EMBODIMENT

The invention will now be described in detail by way of a preferred embodiment shown by the drawings.

Figure 1:
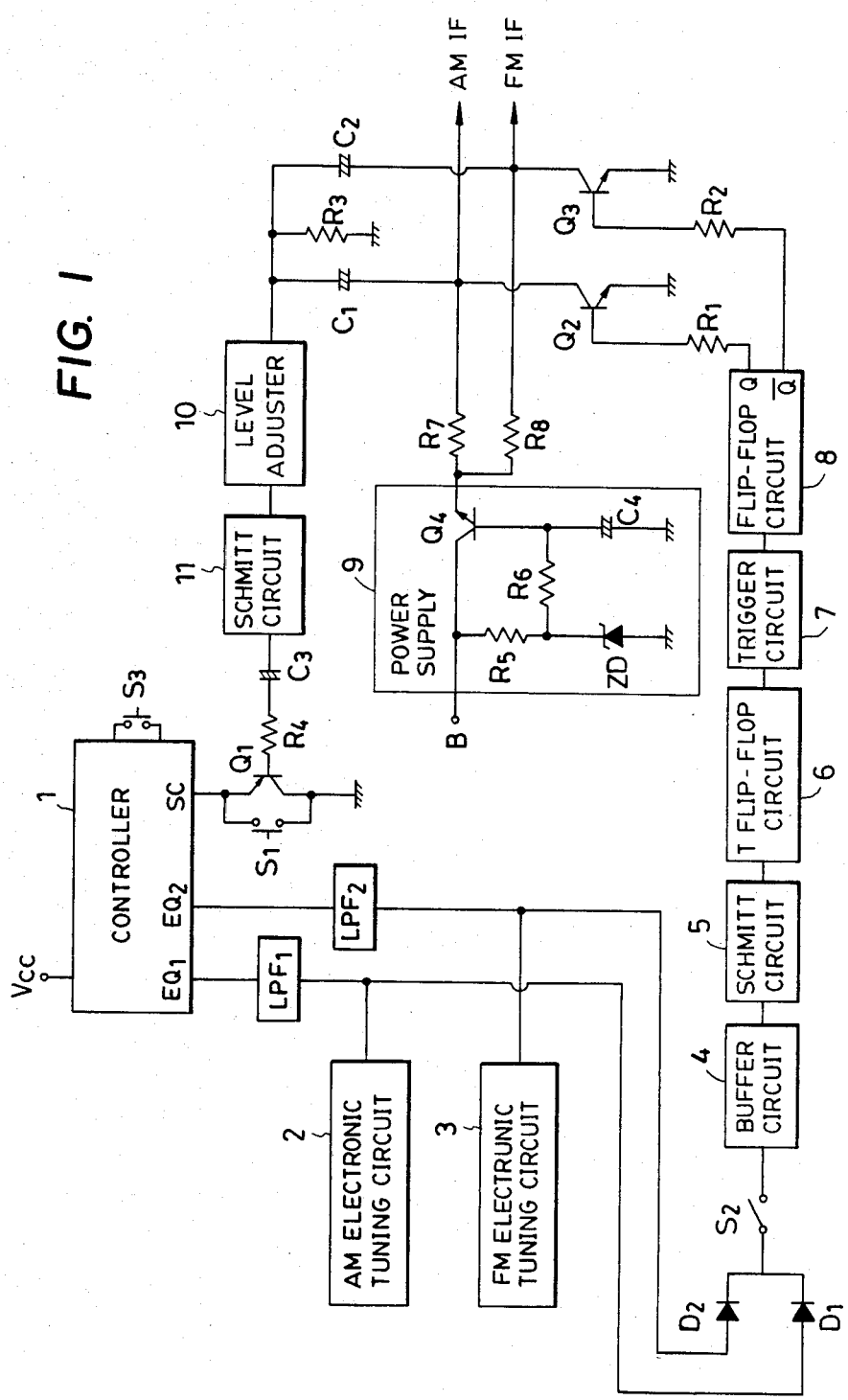
FIG. 1 is a circuit diagram of an auto-scan changeover system for an AM and FM radio receiver including PLL frequency synthesizers, according to the invention.

FIG. 1 shows a circuit diagram embodying the invention and assembled in ,an AM and FM radio receiver employing PLL frequency synthesizers.

Figure 2A:
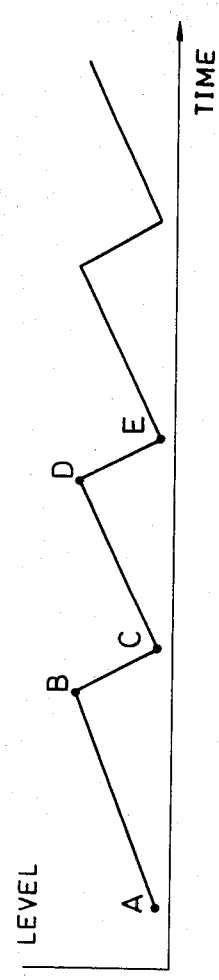
FIGS. 2(a), 2(b) and 2(c) show waveforms of signals at a variety of stages of the circuit of FIG. 1.
Figure 2B:
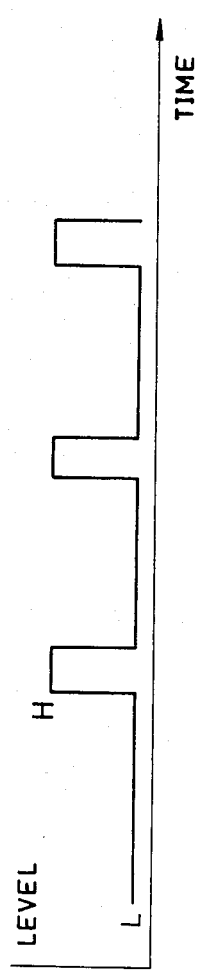

In FIG. 1, a controller 1 includes known PLL frequency synthesizers for an AM,and FM radio receiver and includes an AM and FM auto-scanning circuits associated with the synthesizers, respectively, as shown in FIG. 3. The AM and FM auto-scanning circuits alternatively scan the AM and FM bands responsively to an on-operation of a scan switch $S_1$ connected to a scan terminal SC or responsively. to conduction of a switching transistor $Q_1$. The controller 1 has terminals $EQ_1$ and $EQ_2$ which send out outputs (tuning frequency scanning signals) from phase detectors in the AM and FM PLL frequency synthesizers, respectively, and send out sawtooth voltage signals (FIG. 2(a)) in response to the scanning operation of the AM or FM auto-scanning circuit. The output of the AM phase detector from the terminal $EQ_1$ of the controller 1 is applied to an AM electronic tuning circuit 2 via a low pass filter $LPF_1$ whereas the output of the FM phase detector from the terminal $EQ_2$ is applied to an FM electronic tuning circuit 3 via a low pass filter $LPF_2$. Outputs of the low pass filters $LPF_1$ and $LPF_2$ are connected to an auto-scan changeover switch $S_2$ via reverse-current preventing diodes $D_1$ and $D_2$.

Figure 2C:
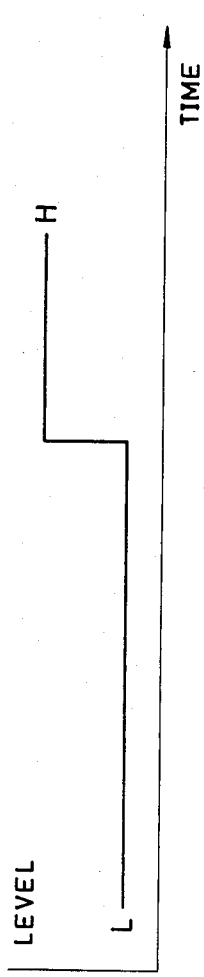

Now assume that the scan switch $S_1$ was turned on and the FM auto-scanning circuit now scans the FM band. Responsively to an on-operation of the auto-scan changeover switch $S_2$, the output signal (FIG. 2(a)) from the FM phase detector is applied to a Schmitt circuit 5 via a buffer circuit 4. The Schmitt circuit 5 produces the sloping down components of the sawteeth output signals (B to C and D to E in FIG. 2(a)), i.e. pulse signals each lasting for a time from the completion of a scanning operation from the lowest extremity to the highest extremity of the band to the start of a succeeding scanning operation. The pulse signals are then applied to a T flip-flop circuit 6 which serves as a counter. The flip-flop circuit 6 reverts its output when it receives a predetermined number (two in the embodiment) of pulse signals, i.e. after the scanning operation is repeated predetermined times as selected in view of the broadcasting circumstances. The output reversion (level L to level H in FIG. 2(c)) of the T flip-flop circuit 6 shows that no desired broadcasting program was found in the FM band. The output of the T flip-flop circuit 6 is thereafter applied to a trigger circuit 7 to trigger a flip-flop circuit 8. The flip-flop circuit 8 is designed so that the Q output and $\overline{Q}$ output thereof are reverted by a trigger signal from the trigger circuit 7.

The Q output of the flip-flop circuit 8 is connected to the base of a transistor $Q_2$ via a protective resistor $R_1$ whereas the $\overline{Q}$ output is connected to the base of a transistor $Q_3$ via a protective resistor $R_2$. The emitter of the transistor $Q_2$ is connected to earth and the collector is connected to a stabilized power supply 9 via a resistor $R_7$ and also to the IF stage of the AM circuit, for example. The emitter of the transistor $Q_3$ is connected to earth and the collector is connected to the power supply 9 via a resistor $R_8$ and also to the IF stage of the FM circuit. The both collectors of the transistors $Q_2$ and $Q_3$ are also connected to a level adjuster 10 via capacitors $C_1$ and $C_2$, respectively.

Thus, if a given scanning operation of the FM band is completed but a desired broadcasting program is not found, the trigger signal is entered in the flip-flop circuit 8, thereby reverting the Q output of the flip-flop circuit 8 from level H to level L and the $\overline{Q}$ output from level L to level H. As the result, the transistor $Q_3$ is conducted and blocks the power supply from the power source 9 to the FM circuit. The transistor $Q_2$ is concurrently non-conducted, thereby permitting the power supply from the source 9 to the AM circuit. Thus, the band changeover from the FM reception to the AM reception is automatically performed. At the same time, a voltage generated upon the changeover of the power source by the transistors $Q_2$ and $Q_3$ is detected as a pulse signal through the capacitor $C_2$. A resistor $R_3$ serves as a discharge resistance of the capacitors $C_1$ and $C_2$. The detected signal is then waveform shaped by the level adjuster 10 and the Schmitt circuit 11 and is thereafter applied to the base of the switching transistor $Q_1$ via a capacitor $C_3$ and a protective resistor $R_4$. As the result, the transistor $Q_1$ is conducted, thereby rendering the FM auto-scan circuit in the controller 1 inoperative while making the AM auto-scan circuit start its scanning operation.

When the AM auto-scan circuit is thus actuated, the AM band from 531 to 1602 kHz (in Japan) is scanned. If no desired broadcasting program is found in the AM band, either, the output of the flip-flop circuit 8 is reverted in the substantially same manner as described above, the FM reception mode is recovered due to conduction of the transistor $Q_2$ and non-conduction of the transistor $Q_3$, thereby making the FM auto-scan circuit restart its scanning operation.

On the other hand, if the desired broadcasting program is found in the auto-scanning operation of the FM or AM band, the auto-scanning mode may be cancelled by turning on a station memory switch $S_3$.

As described above, according to the invention, the auto-scan changeover system for a radio receiver employing two-band or three-band PLL frequency synthesizers does not require any manual operation for selection of a broadcasting program because the scanning operation is automatically switched from the FM to AM band if the desired program is not found by a scanning of the FM band, for example. Therefore, if the invention is applied to a car radio, it contributes to safe driving of a car.

We claim:

1. An auto-scan changeover system for a two-band radio receiver employing PLL (phase-locked loop) frequency synthesizers, said system comprising:
   first and second PLL frequency synthesizers for first and second broadcasting bands, respectively;
   first detecting circuit responsive to a tuning frequency scanning signal from said respective synthesizers to detect completion of a scanning operation of said first or second broadcasting band;
   first switching circuit responsive to a detection signal from said first detecting circuit to switch a power supply between first and second broadcasting band reception circuits in said radio receiver so as to render said first or second broadcasting band reception circuit operative for reception;
   second detecting circuit for detecting that said first switching circuit switched said power supply to said first or second broadcasting band reception circuit;
   first and second scanning circuits associated with said first and second broadcasting bands, respectively, to control said first and second synthesizers; and
   second switching circuit responsive to a detection signal from said second detecting circuit to actuate said first or second scanning circuit.

2. A system as set forth in claim 1 wherein said first and second broadcasting bands are an AM and FM broadcasting bands, respectively.

3. A system as set forth in claim 1 wherein a manual start switch is connected in parallel with said second switching circuit.

* * * * *